United States Patent
Hazbun et al.

(10) Patent No.: US 12,317,562 B2
(45) Date of Patent: May 27, 2025

(54) HIGH ELECTRON MOBILITY TRANSISTORS HAVING BARRIER LINERS AND INTEGRATION SCHEMES

(71) Applicant: GlobalFoundries U.S. Inc., Malta, NY (US)

(72) Inventors: Ramsey Hazbun, Colchester, VT (US); Anthony Stamper, Burlington, VT (US); Zhong-Xiang He, Essex Junction, VT (US); Pernell Dongmo, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 608 days.

(21) Appl. No.: 17/455,016

(22) Filed: Nov. 16, 2021

(65) Prior Publication Data

US 2023/0155016 A1    May 18, 2023

(51) Int. Cl.
| | |
|---|---|
| H10D 62/85 | (2025.01) |
| H10D 30/01 | (2025.01) |
| H10D 30/47 | (2025.01) |
| H10D 62/824 | (2025.01) |
| H10D 64/27 | (2025.01) |

(52) U.S. Cl.
CPC ....... H10D 62/8503 (2025.01); H10D 30/015 (2025.01); H10D 62/824 (2025.01); H10D 64/411 (2025.01); H10D 64/512 (2025.01); H10D 64/513 (2025.01);
(Continued)

(58) Field of Classification Search
CPC ............. H01L 29/7786; H01L 29/2003; H01L 29/205; H01L 29/66462; H01L 29/66431; H01L 29/778; H01L 29/42316; H01L 29/42356; H01L 29/7789; H01L 29/4236
See application file for complete search history.

(56) References Cited

U.S. PATENT DOCUMENTS

| | | |
|---|---|---|
| 7,592,211 B2 | 9/2009 | Sheppard et al. |
| 7,772,676 B2 | 8/2010 | Han et al. |
| | (Continued) | |

FOREIGN PATENT DOCUMENTS

| | | | |
|---|---|---|---|
| EP | 1865561 A1 | | 2/2013 |
| KR | 20140014778 A | * | 2/2014 |

OTHER PUBLICATIONS

He et al., High Threshold Voltage Uniformity and Low Hysteresis Recessed-Gate Al2O3/AlN/GaN MISFET by Selective Area Growth, IEEE Transactions on Electron Devices, Apr. 2017, pp. 1554-1560, vol. 64—No. 4, IEEE.

(Continued)

*Primary Examiner* — Joseph C. Nicely
*Assistant Examiner* — Alvin L Lee
(74) *Attorney, Agent, or Firm* — David Cain

(57) ABSTRACT

A transistor structure is provided, the structure may be for a high electron mobility transistor (HEMT). The HEMT comprises a channel layer arranged over a substrate, the channel layer may have a top surface. A barrier layer may be arranged over the channel layer. A first opening may be in the barrier layer and extend partially into the channel layer. A first barrier liner may be arranged in the first opening and over the channel layer, the first barrier liner may have a bottom surface. The bottom surface of the first barrier liner may be lower than the top surface of the channel layer.

18 Claims, 5 Drawing Sheets

(52) U.S. Cl.
CPC ........... *H10D 30/47* (2025.01); *H10D 30/475* (2025.01); *H10D 30/478* (2025.01)

(56) References Cited

U.S. PATENT DOCUMENTS

| | | | |
|---|---|---|---|
| 9,318,593 B2* | 4/2016 | Wu | ..................... H01L 29/7786 |
| 10,396,192 B2 | 8/2019 | Iucolano et al. | |
| 10,644,128 B1* | 5/2020 | Chen | .................... H10D 64/512 |
| 2005/0258451 A1 | 11/2005 | Saxler et al. | |
| 2012/0313106 A1 | 12/2012 | He | |
| 2019/0189762 A1* | 6/2019 | Chu | ................... H01L 29/2003 |
| 2021/0234030 A1* | 7/2021 | Sun | ................... H01L 29/41766 |

OTHER PUBLICATIONS

Mahaboob et al., Selective Area Epitaxial Growth of Stretchable Geometry AlGaN—GaN Heterostructures, Journal of Electronic Materials, 2018, pp. 6625-6634, vol. 47, The Minerals, Metals Materials Society.

* cited by examiner

HIGH ELECTRON MOBILITY TRANSISTORS HAVING BARRIER LINERS AND INTEGRATION SCHEMES

FIELD OF THE INVENTION

The disclosed embodiments relate generally to high electron mobility transistors (HEMTs), and more particularly, to high electron mobility transistors having barrier liners and integration schemes.

BACKGROUND

High electron mobility transistors are of particular interest for high power and/or high frequency applications. These devices may offer advantages due to the formation of a two-dimensional electron gas (2DEG) at the heterojunction of two semiconductor materials with different bandgap energies. The 2DEG is an accumulation layer in the smaller bandgap material and can contain a very high sheet electron concentration more than, for example, $10^{13}$ electrons/cm$^2$. Additionally, electrons may transfer from the wider bandgap semiconductor to the 2DEG, allowing a high electron mobility due to reduced ionized impurity scattering. This combination of high carrier concentration and high carrier mobility provide the HEMTs a very large transconductance and may provide performance advantages over metal-semiconductor field effect transistors (MESFETs) for high frequency applications.

It is desirable to have controllable threshold voltage values across different devices. However, it is challenging to control the threshold voltage values of the HEMTs for different devices, especially for devices with different channel lengths. Thus, there is a need to overcome the challenges mentioned above.

SUMMARY

In an aspect of the present disclosure, a transistor structure is provided. The structure comprises a channel layer arranged over a substrate, the channel layer may have a top surface. A barrier layer may be arranged over the channel layer. A first opening may be in the barrier layer, the first opening may extend partially into the channel layer. A first barrier liner may be arranged in the first opening and over the channel layer. The first barrier liner may have a bottom surface. The bottom surface of the first barrier liner may be lower than the top surface of the channel layer.

In another aspect of the present disclosure, a transistor structure is provided. The structure comprises a channel layer arranged over a substrate, the channel layer may have a top surface. A barrier layer may be arranged over the channel layer, the barrier layer may have a top surface. A first gate opening may be in the barrier layer, the first gate opening may extend partially into the channel layer. A first barrier liner may be arranged in the first gate opening and over the channel layer, the first barrier liner may have side portions and a bottom surface. The bottom surface of the first barrier liner may be lower than the top surface of the channel layer. A top surface of the side portions of the first barrier liner may be approximately coplanar with the top surface of the barrier layer.

In yet another aspect of the present disclosure, a method of fabricating a transistor structure is provided. The method comprises forming a channel layer over a substrate, the channel layer having a top surface. A barrier layer may be formed over the channel layer. A first opening may be formed in the barrier layer, the first opening may extend partially into the channel layer. A first barrier liner may be formed in the first opening and over the channel layer, the first barrier liner having a bottom surface. The bottom surface of the first barrier liner may be lower than the top surface of the channel layer.

BRIEF DESCRIPTION OF THE DRAWINGS

The disclosed embodiments will be better understood from a reading of the following detailed description, taken in conjunction with the accompanying drawings.

Figure 1:
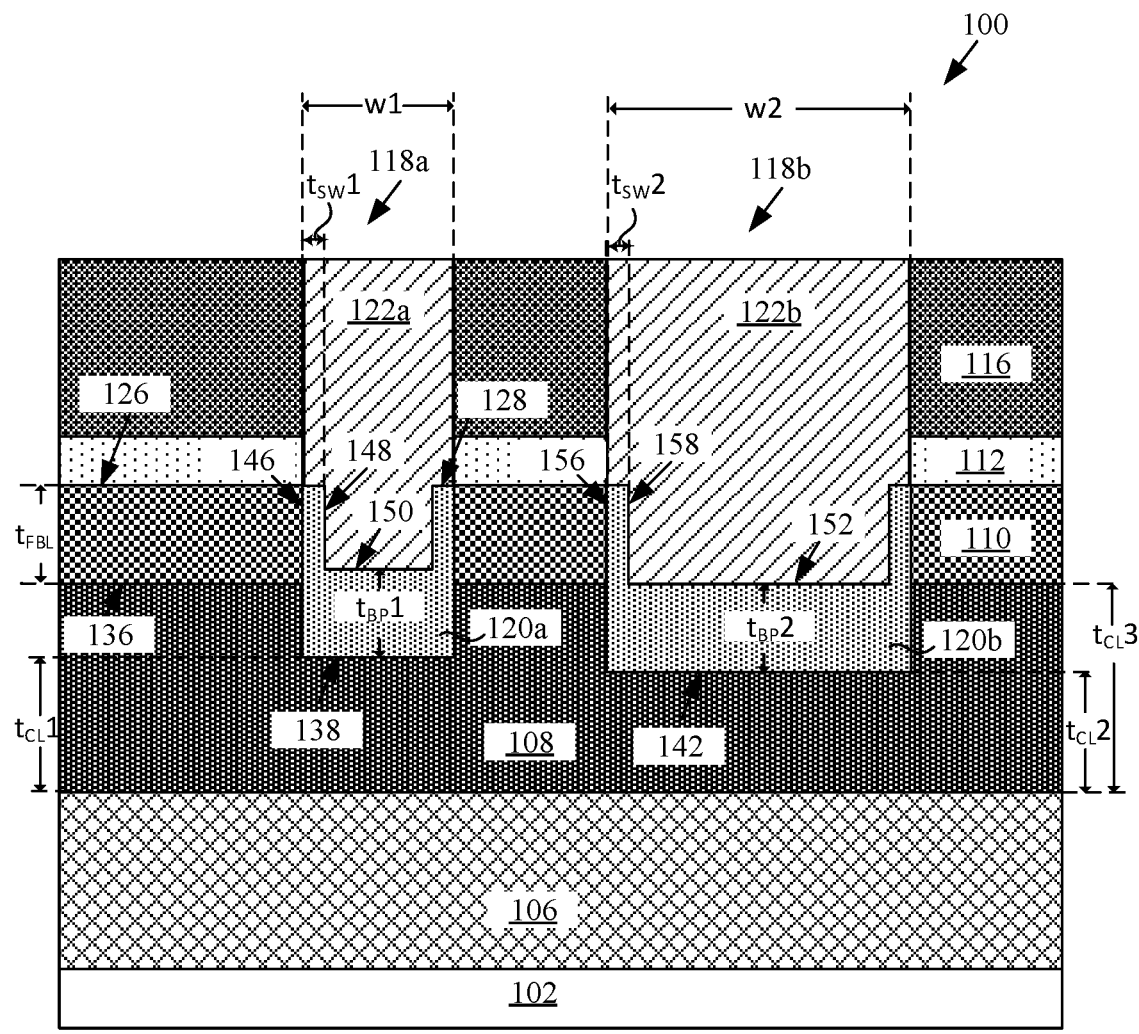
FIG. 1 illustrates a cross-sectional view of a transistor structure, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1 illustrates a cross-sectional view of a transistor structure 100, according to an embodiment of the disclosure. The structure 100 may be for a high electron mobility transistor. The structure 100 may include a substrate 102, a buffer layer 106, a channel layer 108, a barrier layer 110, a dielectric cap layer 112, a dielectric passivation layer 116, a first gate opening 118a, a second gate opening 118b, a first barrier liner 120a and a first gate electrode 122a in the first gate opening 118a, and a second barrier liner 120b and a second gate electrode 122b in the second gate opening 118b. The buffer layer 106 may be arranged over the substrate 102. The channel layer 108 may be arranged over the buffer layer 106 and may have a top surface 136 in direct contact with the barrier layer 110. The barrier layer 110 may be arranged above the channel layer 108 and have a top surface 126 in direct contact with the dielectric cap layer 112. A dielectric passivation layer 116 may be arranged over and directly contacting the dielectric cap layer 112.

The first gate opening 118a may be a gate opening of a short channel device, and the first gate opening 118a may extend through the dielectric passivation layer 116, the dielectric cap layer 112, the barrier layer 110, and partially into the channel layer 108. The first gate opening 118a may have sidewalls including side surfaces in the dielectric passivation layer 116, the dielectric cap layer 112, the barrier layer 110 and the channel layer 108. The first gate opening 118a may also have a bottom surface in the channel layer 108. The first barrier liner 120a may have side portions and a lower portion. The side portions of the first barrier liner 120a may be arranged on part of the sidewalls of the first gate opening 118a. The lower portion of the first barrier liner 120a may be arranged on the bottom surface of the first gate opening 118a. The lower portion of the first barrier liner 120a may have a bottom surface 138 in contact with the channel layer 108, and a top surface 150 opposite to the bottom surface 138. The top surface 150 of the lower portion of the first barrier liner 120a may be in direct contact with the first gate electrode 122a. The bottom surface 138 of the first barrier liner 120a may be lower than a top surface 136 of the channel layer 108. The barrier layer 110 may have a thickness $t_{FBL}$ taken from the top surface 136 of the channel layer 108 to the top surface 126 of the barrier layer 110. The lower portion of the first barrier liner 120a may have a thickness $t_{BP}1$ taken from the bottom surface 138 to the top surface 150. The thickness $t_{FBL}$ of the barrier layer 110 may be approximately the same as the thickness $t_{BP}1$ of the lower portion of the first barrier liner 120a. The thickness $t_{BP}1$ may have a range of 4 to 40 nm. The thickness $t_{BP}1$ determines a threshold voltage of the short channel device of the structure 100. Better control of the thickness $t_{BP}1$ is achieved, leading to improved reproducibility of the threshold voltage. The barrier liners 120a and 120b and the barrier layer 110 may be made of the same material, for example, the same semiconductor material such as aluminum gallium nitride.

The side portions of the first barrier liner 120a may have a thickness $t_{SW}1$ taken from a sidewall 146 to an inner side surface 148 of the first barrier liner 120a. The sidewall 146 may refer to a side surface of the barrier layer 110 in contact with the side portion of the first barrier liner 120a. The first gate opening 118a may have a width w1. The thickness $t_{SW}1$ may represent a small fraction of the width w1 and may be less than the thickness $t_{BP}1$. Hence, the side portions of the first barrier liner 120a do not have a significant effect on the threshold voltage. For example, the thickness $t_{SW}1$ may have a range of 2 to 20 nm and the width w1 may have a range of 50 to 200 nm. A top surface 128 of the side portions of the first barrier liner 120a may be approximately coplanar with the top surface 126 of the barrier layer 110. The first barrier liner 120a may be arranged next to the barrier layer 110 and the channel layer 108 at part of the sidewalls of the first gate opening 118a and over the channel layer 108 at the bottom surface of the first gate opening 118a.

A first gate electrode 122a may be arranged over the first barrier liner 120a in the first gate opening 118a. The first barrier liner 120a may fully separate the first gate electrode 122a from the barrier layer 110 and the channel layer 108. The first gate electrode 122a may be arranged next to the dielectric cap layer 112 and the dielectric passivation layer 116 at another part of the sidewalls of the first gate opening 118a.

The second gate opening 118b may be a gate opening for a long channel device and may extend through the dielectric passivation layer 116, the dielectric cap layer 112, the barrier layer 110, and into a part of the channel layer 108. The second gate opening 118b may have sidewalls including side surfaces in the dielectric passivation layer 116, the dielectric cap layer 112, the barrier layer 110 and the channel layer 108. The second gate opening 118b may also have a bottom surface in the channel layer 108. The second gate opening 118b may have a width w2 which may be longer than the width w1. For example, the width w2 may have a range of 200 to 2000 nm. The bottom surface of the second gate opening 118b may be arranged lower than the bottom surface of the first gate opening 118a. The second gate opening 118b may extend further into the channel layer 108 than the first gate opening 118a.

The second barrier liner 120b may have side portions and a lower portion. The side portions of the second barrier liner 120b may be arranged on part of the sidewalls of the second gate opening 118b. For example, the side portions of the second barrier liner 120b may be arranged on the side surfaces of the barrier layer 110. The lower portion of the second barrier liner 120b may be arranged over the bottom surface of the second gate opening 118b. The lower portion of the second barrier liner 120b may have a bottom surface 142 in contact with the channel layer 108 and a top surface 152 opposite to the bottom surface 142. The bottom surface 142 may be lower than the top surface 136 of the channel layer 108. The top surface 152 may be in direct contact with the second gate electrode 122b. A thickness $t_{BP}2$ of the lower portion of the second barrier liner 120b may be taken from the bottom surface 142 to the top surface 152 of the lower portion of the second barrier liner 120b. The thickness $t_{BP}2$ may approximately equal to the thickness $t_{FBL}$ of the barrier layer 110. In an embodiment, the thickness $t_{BP}2$ may be approximately equal to the thickness $t_{BP}1$. The thickness $t_{BP}2$ determines a threshold voltage of the long channel device. Better control of the thickness $t_{BP}2$ is achieved, leading to improved reproducibility of the threshold voltage.

A portion of the channel layer 108 arranged directly below the second gate opening 118b may be thinner than another portion of the channel layer 108 arranged directly below the first gate opening 118a. For example, the channel layer 108 below the first gate opening 118a has a thickness $t_{CL}1$ taken from a top surface of the buffer layer 106 to the bottom surface 138 of the first barrier liner 120a. The channel layer 108 below the second gate opening 118b has a thickness $t_{CL}2$, taken from the top surface of the buffer layer 106 to the bottom surface 142 of the second barrier liner 120b. In one embodiment, $t_{CL}1$ may be thicker than $t_{CL}2$. The thickness $t_{CL}2$ may be at least 5 to 10 times the thickness $t_{BP}2$ of the lower portion of the second barrier liner 120b. Hence, the channel layer 108 below the second gate opening 118b may be thicker than the thickness $t_{BP}2$. Additionally, the gate openings 118a and 118b may extend into small portions of the channel layer 108. For example, the channel layer 108 below the barrier layer 110 may have a thickness $t_{CL}3$, taken from the top surface of the buffer layer 106 to the top surface 136 of the channel layer 108, in the range of 150 to 500 nm. Hence the formation of the gate openings 118a and 118b in part of the channel layer 108 do not affect the operation of the short channel and long channel devices, respectively.

The side portions of the second barrier liner 120b may have a thickness $t_{SW}2$, taken from a sidewall 156 of the second gate opening 118b to an inner side surface 158 of the second barrier liner 120b. The sidewall 156 may refer to a side surface of the barrier layer 110 in contact with the side portion of the second barrier liner 120b. The thickness $t_{SW}2$ of the side portions may be thinner than the thickness $t_{BP}2$ of the lower portion. Additionally, the thickness $t_{SW}2$ may be thinner than the width w2 of the second gate opening 118b.

Hence, the side portions of the second barrier liner 120b do not affect the threshold voltage of the long channel device.

A second gate electrode 122b may be arranged over the second barrier liner 120b in the second gate opening 118b, whereby the second gate electrode 122b may be fully separated from the barrier layer 110 and the channel layer 108 by the second barrier liner 120b. The gate electrodes 122a and 122b may fill up the gate openings 118a and 118b, respectively. The gate electrodes 122a and 122b may be gate contacts for the short channel and the long channel devices, respectively. Although not shown for simplicity, a source and a drain may be formed in the barrier layer 110 and arranged next to the sides of each of the gate openings 118a and 118b.

The substrate 102 may be made of silicon, silicon carbide, graphene, diamond, sapphire, or any composite substrate suitable for gallium nitride/aluminum gallium nitride epitaxy and the buffer layer 106 may be made of aluminum gallium nitride and aluminum nitride superlattices. The channel layer 108 may be made of gallium nitride in a preferred embodiment. In an alternative embodiment, the channel layer 108 may be made of carbon-doped gallium nitride (C-GaN) and gallium nitride. The barrier layer 110 may be made of aluminum gallium nitride in a preferred embodiment. In an alternative embodiment, the barrier layer 110 may be made of aluminum nitride or a combination of aluminum gallium nitride and aluminum nitride. The dielectric cap layer 112 may be made of silicon nitride, silicon carbon, or any other suitable dielectric material. The dielectric passivation layer 116 may be made of silicon dioxide, carbon doped oxide dielectrics comprised of silicon, carbon, oxygen, and hydrogen (SiCOH), or any other suitable dielectric material. The gate electrodes 122a and 122b may be made of titanium nitride, tantalum nitride, aluminum, copper, nickel, or its combination.

Figure 2:
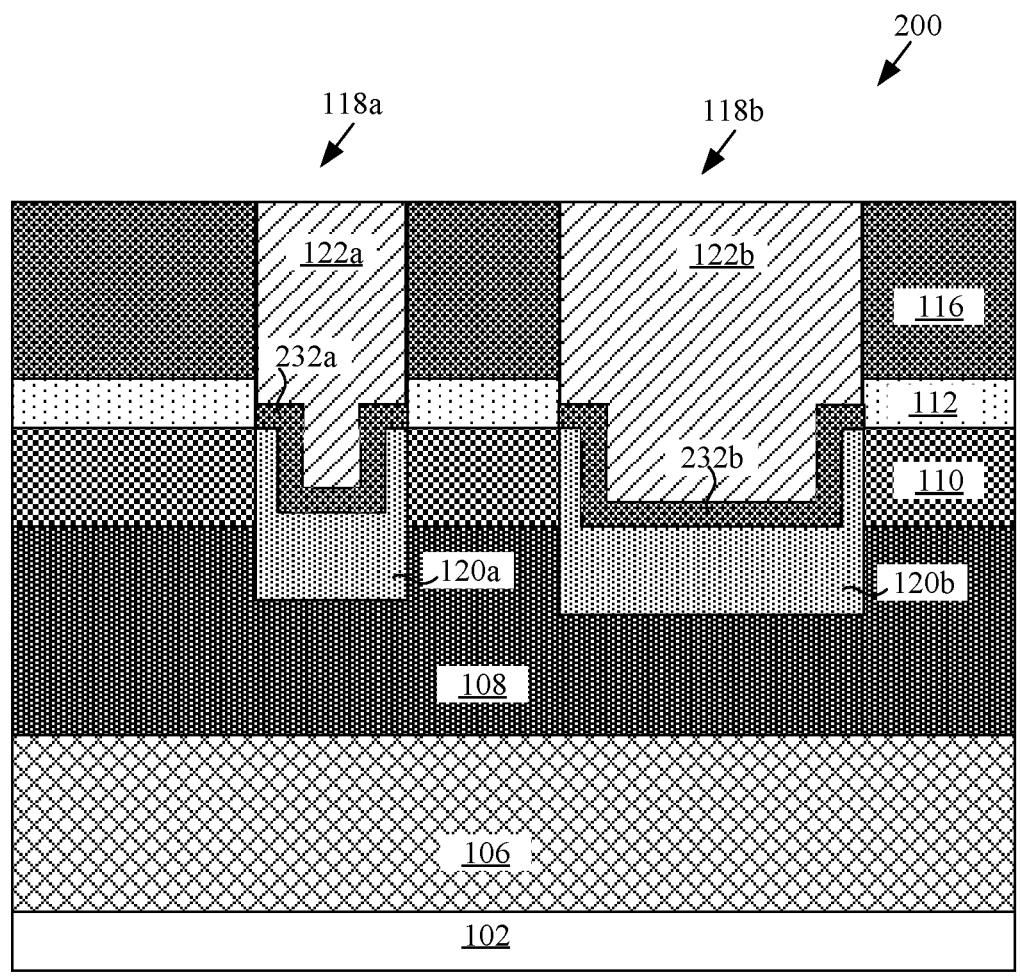
FIG. 2 illustrates a cross-sectional view of a transistor structure, according to another embodiment of the disclosure.

The embodiments shown in FIG. 1 may be modified to form alternative embodiments without departing from the scope of the disclosure. For example, FIG. 2 illustrates a cross-sectional view of a transistor structure 200, according to another embodiment of the disclosure. Like numerals in FIG. 1 may refer to like features in FIG. 2. In contrast to the structure 100, the structure 200 shows a first gate dielectric layer 232a separating a first gate electrode 122a from a first barrier liner 120a in a first gate opening 118a. Additionally, the structure 200 shows a second gate dielectric layer 232b between a second gate electrode 122b and a second barrier liner 120b in a second gate opening 118b. The gate dielectric layers 232a and 232b may electrically insulate the gate electrodes, 122a and 122b, respectively, from the barrier liners, 120a and 120b, respectively. The gate dielectric layers 232a and 232b may be made of an oxide of aluminum. The structure 200 may be for a metal insulator semiconductor high electron mobility transistor (MIS-HEMT). An advantage of the structure 200 may be due to lower leakage current.

Figure 3:
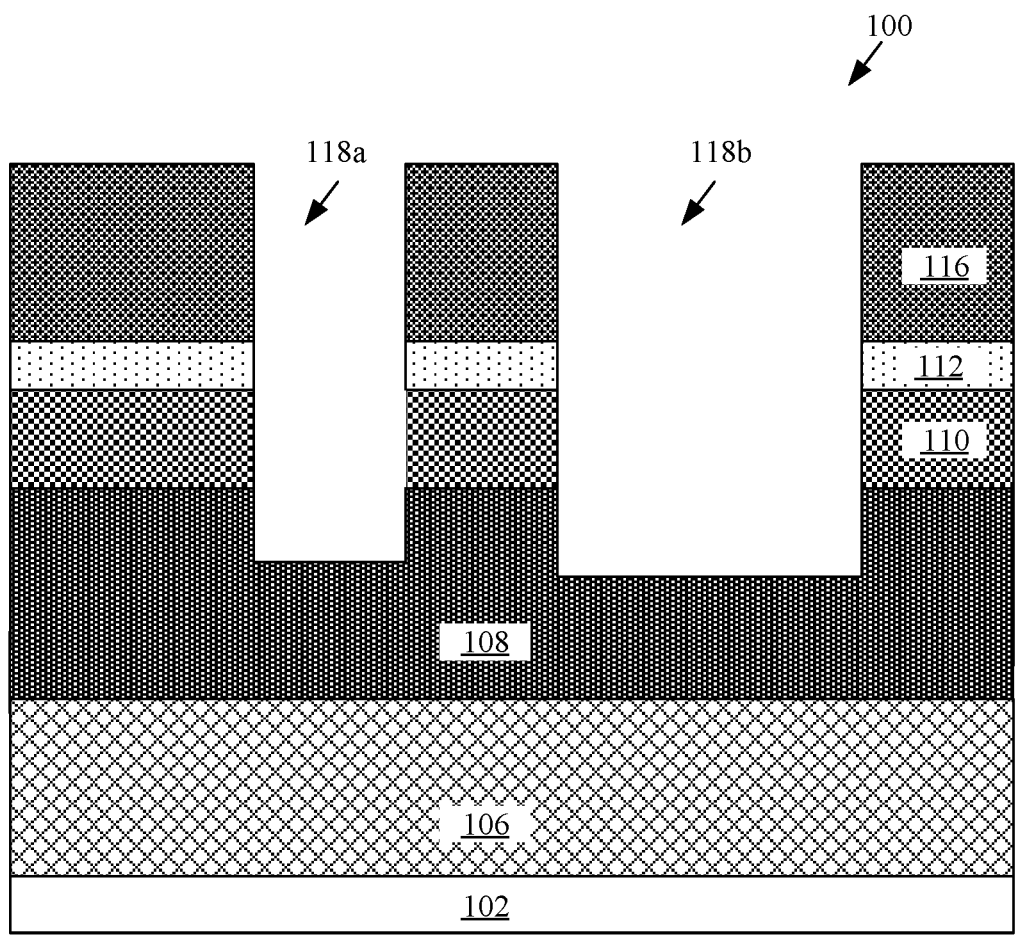
FIGS. 3 to 4 illustrate a fabrication process flow for the transistor structure shown in FIG. 1, according to some embodiments of the disclosure.
Figure 4:
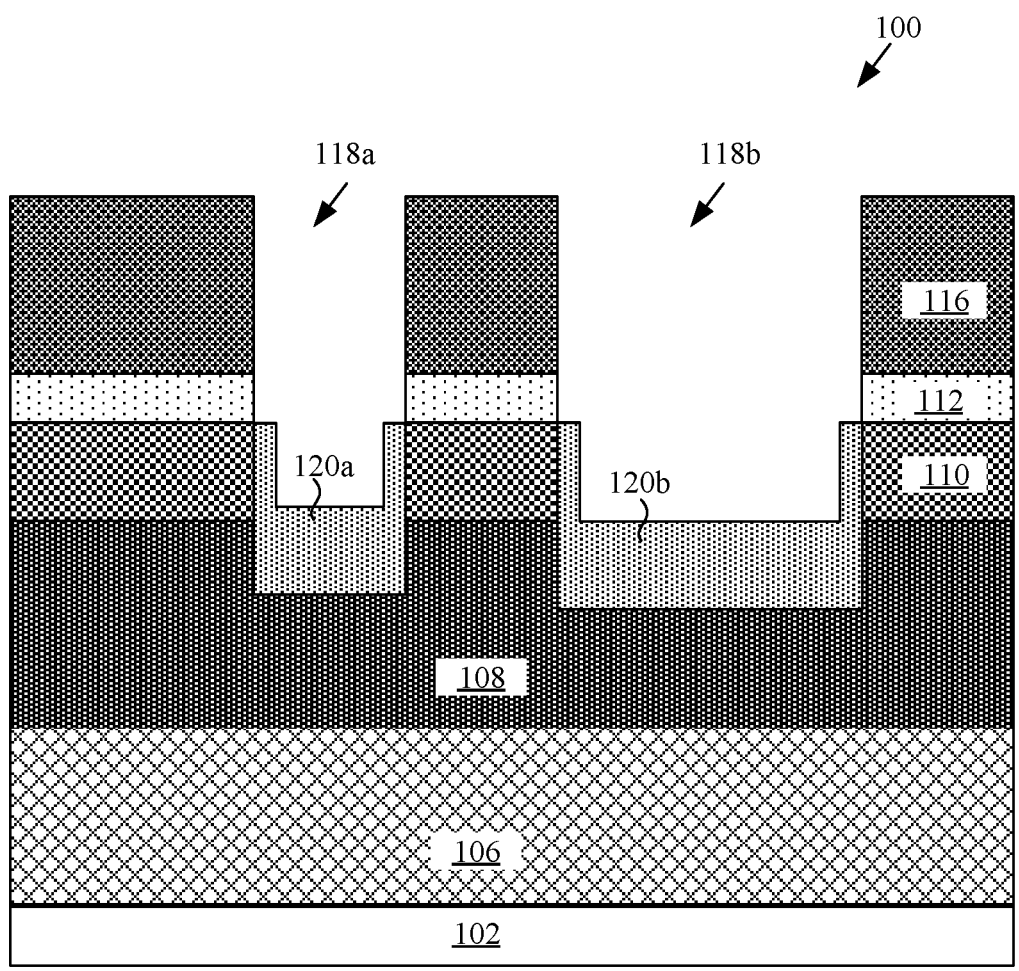

FIGS. 3 to 4 illustrate a fabrication process flow for the transistor structure 100 shown in FIG. 1, according to some embodiments of the disclosure. FIG. 3 illustrates a cross-sectional view of a partially completed transistor structure 100 after formation of a channel layer 108, a barrier layer 110, a dielectric cap layer 112, a dielectric passivation layer 116, and gate openings 118a and 118b, according to an embodiment of the disclosure. Referring to FIG. 3, the channel layer 108 may be formed over a buffer layer 106 arranged above a substrate 102. The channel layer 108 may be formed by epitaxial growth, molecular beam epitaxy, metal oxide chemical vapor deposition, plasma assisted molecular beam epitaxy, or any other suitable process. The barrier layer 110 may be formed over the channel layer 108 by epitaxial growth, molecular beam epitaxy, metal oxide chemical vapor deposition, plasma assisted molecular beam epitaxy, or any other suitable process. The dielectric cap layer 112 may be deposited over the barrier layer 110 and the dielectric passivation layer 116 may be deposited over the dielectric cap layer 112. The dielectric cap layer 112 and the dielectric passivation layer 116 may be deposited by atomic layer deposition, chemical vapor deposition, physical vapor deposition, or any other suitable deposition processes. The gate openings 118a and 118b may be formed by patterning the dielectric passivation layer 116, dielectric cap layer 112, barrier layer 110 and channel layer 108 by a photolithography process. In the photolithography process, a photoresist layer may be deposited over a top surface of the dielectric passivation layer 116 and subsequently exposed and developed to form a suitable photoresist pattern. A wet or dry etch process may be used to remove portions of the dielectric passivation layer 116, dielectric cap layer 112, barrier layer 110 and channel layer 108 not covered by the photoresist pattern to form the gate openings 118a and 118b. The etching processes may etch through the dielectric passivation layer 116, dielectric cap layer 112, and barrier layer 110 and partially etch into the channel layer 108. The other portions of the dielectric passivation layer 116, dielectric cap layer 112, barrier layer 110 and channel layer 108 below the photoresist pattern may be left behind. The photoresist pattern may subsequently be removed. The first gate opening 118a may be shallower than the second gate opening 118b.

FIG. 4 illustrates a cross-sectional view of a partially completed transistor structure 100 after formation of barrier liners 120a and 120b in the gate openings 118a and 118b, respectively, according to an embodiment of the disclosure. The barrier liners 120a and 120b may be selectively grown on the barrier layer 110 and the channel layer 108 at sidewalls of the gate openings 118a and 118b, respectively. Additionally, the barrier liners 120a and 120b may be selectively grown on the channel layer 108 at bottom surfaces of the gate openings 118a and 118, respectively. The barrier liners 120a and 120b may be selectively grown by an epitaxial process.

The fabrication process may continue to form the transistor structure 100 illustrated in FIG. 1. Referring to FIG. 1, a layer of a suitable metal, for example, titanium nitride, tantalum nitride, aluminum, copper, nickel or its combination, may be deposited over the barrier liners 120a and 120b in the gate openings 118a and 118b, respectively. The metal may be deposited by electroplating, atomic layer deposition, physical vapor deposition, chemical vapor deposition, plasma enhanced chemical vapor deposition, or any other suitable deposition processes. A suitable planarization process, for example, chemical mechanical planarization, may remove portions of the metal from a top surface of the dielectric passivation layer 116 next to the openings 118a and 118b. The process may leave behind other portions of the metal in the gate openings 118a and 118b, thereby forming the gate electrodes 122a and 122b, respectively.

Figure 5:
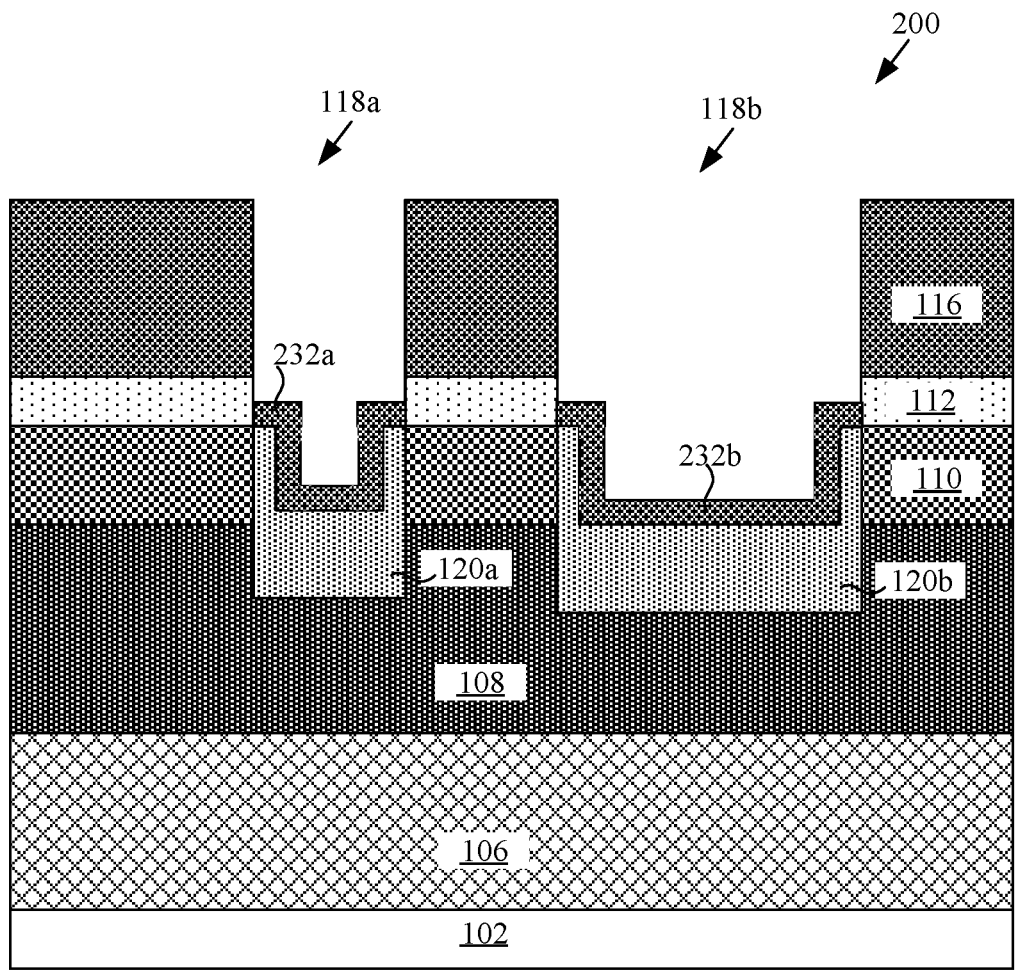
FIG. 5 illustrates a partially completed transistor structure shown in FIG. 2 after formation of a channel layer, a barrier layer, a dielectric cap layer, a dielectric passivation layer, first and second gate openings, first and second barrier liners, and gate dielectric layers, according to an embodiment of the disclosure.

FIG. 5 illustrates a partially completed transistor structure 200 shown in FIG. 2 after formation of a channel layer 108, a barrier layer 110, a dielectric cap layer 112, a dielectric passivation layer 116, gate openings 118a and 118b, barrier liners 120a and 120b, and gate dielectric layers 232a and 232b, according to an embodiment of the disclosure. The channel layer 108 may be formed over the buffer layer 106 arranged above the substrate 102. The formation of the channel layer 108 for the structure 200 may be like the formation of the channel layer 108 for the structure 100 shown in FIG. 3. The formation of the barrier layer 110, dielectric cap layer 112, dielectric passivation layer 116, and gate openings 118a and 118b of the structure 200 may be like the formation of like features of the structure 100 shown in FIG. 3. The formation of the barrier liners 120a and 120b of the structure 200 may be like the formation of like features of the structure 100 shown in FIG. 4. The first gate dielectric layer 232a may be uniformly deposited on side portions and a lower portion of the first barrier liner 120a. Additionally, the second gate dielectric layer 232b may be uniformly deposited on side portions and a lower portion of the second barrier liner 120b. Although not shown, the gate dielectric layers 232a and 232b may be deposited on the dielectric cap layer 112 and dielectric passivation layer 116 above the barrier liners 120a and 120b. The gate dielectric layers 232a and 232b may be deposited by atomic layer deposition, chemical vapor deposition, physical vapor deposition or any other suitable deposition processes.

The process may continue to form the transistor structure 200 shown in FIG. 2. Referring to FIG. 2, a first gate electrode 122a may be deposited over the first gate dielectric layer 232a, thereby filling up the first gate opening 118a. A second gate electrode 122b may be deposited over the second gate dielectric layer 232b, thereby filling up the second gate opening 118b. The fabrication of the gate electrodes 122a and 122b of the structure 200 may be like the fabrication of like features of the structure 100 shown in FIG. 1.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A transistor structure comprising:
a channel layer over a substrate, the channel layer having a top surface;
a barrier layer over the channel layer;
a first opening in the barrier layer, the first opening extending partially into the channel layer; and
a first barrier liner in the first opening and over the channel layer, the first barrier liner having a bottom surface, wherein the bottom surface of the first barrier liner is lower than the top surface of the channel layer;
a second opening in the barrier layer, the second opening extending partially into the channel layer, wherein the first opening has a first width, the second opening has a second width longer than the first width; and
a second barrier liner in the second opening and over the channel layer, the second barrier liner having a bottom surface, wherein the bottom surface of the second barrier liner is lower than the top surface of the channel layer.

2. The structure of claim 1, wherein the first barrier liner comprises a lower portion, the lower portion of the first barrier liner has a thickness that is approximately the same as a thickness of the barrier layer.

3. The structure of claim 1, wherein the barrier layer and the first barrier liner are made of the same material.

4. The structure of claim 2, wherein the barrier layer has side surfaces, the first barrier liner comprises side portions, and the side portions of the first barrier liner are on the side surfaces of the barrier layer.

5. The structure of claim 4, wherein each of the side portions of the first barrier liner having a thickness that is lesser than the thickness of the lower portion.

6. The structure of claim 1, wherein the second barrier liner further comprises a lower portion, the lower portion of the second barrier liner has a thickness that is approximately the same as the thickness of the barrier layer.

7. The structure of claim 6, wherein a portion of the channel layer directly below the second opening is thinner than a portion of the channel layer directly below the first opening.

8. The structure of claim 7, wherein a thickness of the portion of the channel layer directly below the second opening is at least five to ten times the thickness of the lower portion of the second barrier liner.

9. The structure of claim 6, wherein the barrier layer has side surfaces, the second barrier liner comprises side portions, and the side portions of the second barrier liner are on the side surfaces of the barrier layer, and wherein each of the side portions of the second barrier liner has a thickness that is less than the thickness of the lower portion of the second barrier liner.

10. The structure of claim 1, further comprising:
a dielectric cap layer over the barrier layer and a dielectric passivation layer over the dielectric cap layer, wherein the first opening and the second opening extend through the dielectric passivation layer and the dielectric cap layer.

11. The structure of claim 1, further comprising:
a first gate electrode over the first barrier liner in the first opening, a second gate electrode over the second barrier liner in the second opening, wherein the first gate electrode is fully separated from the barrier layer and the channel layer by the first barrier liner and the second gate electrode is fully separated from the barrier layer and the channel layer by the second barrier liner.

12. The structure of claim 1, wherein the channel layer is made of gallium nitride and the barrier layer is made of aluminum gallium nitride.

13. A transistor structure comprising:
a channel layer over a substrate, the channel layer having a top surface;
a barrier layer over the channel layer, the barrier layer having a top surface;
a first gate opening in the barrier layer, the first gate opening extending partially into the channel layer;
a first barrier liner arranged in the first gate opening and over the channel layer, the first barrier liner having side portions and a bottom surface, wherein the bottom surface of the first barrier liner is lower than the top surface of the channel layer; and
a top surface of the side portions of the first barrier liner is approximately coplanar with the top surface of the barrier layer;
a second gate opening in the barrier layer, the second gate opening extending partially into the channel layer, wherein the first gate opening has a first width, the second gate opening has a second width longer than the first width; and
a second barrier liner in the second gate opening and over the channel layer, the second barrier liner having a bottom surface, wherein the bottom surface of the second barrier liner is lower than the top surface of the channel layer.

14. The structure of claim 13, wherein the barrier layer and the first barrier liner are made of the same material.

15. The structure of claim 13, wherein the first barrier liner further comprises a lower portion, the lower portion of the first barrier liner having a thickness that is approximately the same as a thickness of the barrier layer.

16. A method of fabricating a transistor structure, the method comprising:
forming a channel layer over a substrate, the channel layer having a top surface;
forming a barrier layer over the channel layer;
forming a first opening in the barrier layer, the first opening extending partially into the channel layer; and
forming a first barrier liner in the first opening and over the channel layer, the first barrier liner having a bottom surface, wherein the bottom surface of the first barrier liner is lower than the top surface of the channel layer;
forming a second opening in the barrier layer, the second opening extending partially into the channel layer, wherein the first opening has a first width, the second opening has a second width that is longer than the first width; and
forming a second barrier liner in the second opening and over the channel layer, the second barrier liner having a bottom surface, and the bottom surface of the second barrier liner is lower than the top surface of the channel layer.

17. The method of claim 16, further comprising:
forming a dielectric cap layer over the barrier layer;
forming a dielectric passivation layer over the dielectric cap layer, wherein forming the first opening and the second opening includes forming the first opening and the second opening through the dielectric passivation layer and the dielectric cap layer;
the first barrier liner is selectively formed on the channel layer and the barrier layer at sidewalls of the first opening and on the channel layer at a bottom surface of the first opening; and
the second barrier liner is selectively formed on the channel layer and the barrier layer at sidewalls of the second opening and on the channel layer at a bottom surface of the second opening.

18. The structure of claim 13, further comprising a first gate electrode over the first barrier liner and in the first gate opening, wherein the first gate electrode overlaps the top surface of the side portions of the first barrier liner.

* * * * *